United States Patent
Kim

(10) Patent No.: US 9,312,479 B2
(45) Date of Patent: Apr. 12, 2016

(54) VARIABLE RESISTANCE MEMORY DEVICE

(71) Applicant: SK hynix Inc., Icheon-si (KR)

(72) Inventor: Soo Gil Kim, Icheon-si (KR)

(73) Assignee: SK HYNIX INC., Icheon (KR)

( * ) Notice: Subject to any disclaimer, the term of this patent is extended or adjusted under 35 U.S.C. 154(b) by 274 days.

(21) Appl. No.: 13/843,180

(22) Filed: Mar. 15, 2013

(65) Prior Publication Data
US 2014/0145140 A1 May 29, 2014

(30) Foreign Application Priority Data
Nov. 29, 2012 (KR) .................. 10-2012-0137216

(51) Int. Cl.
| | | |
|---|---|---|
| *H01L 47/00* | (2006.01) | |
| *H01L 45/00* | (2006.01) | |
| *G11C 13/00* | (2006.01) | |
| *H01L 27/24* | (2006.01) | |

(52) U.S. Cl.
CPC ............ *H01L 45/06* (2013.01); *G11C 13/0002* (2013.01); *H01L 27/2409* (2013.01); *H01L 45/04* (2013.01); *H01L 45/08* (2013.01); *H01L 45/085* (2013.01); *H01L 45/1233* (2013.01); *H01L 45/1293* (2013.01); *H01L 45/144* (2013.01); *H01L 45/146* (2013.01); *H01L 45/147* (2013.01)

(58) Field of Classification Search
CPC ... H01L 45/04; H01L 27/224; G11C 13/0002
USPC .............................................. 257/4; 365/148
See application file for complete search history.

(56) References Cited

U.S. PATENT DOCUMENTS

| | | | |
|---|---|---|---|
| 2008/0006907 A1 | 1/2008 | Lee et al. | |
| 2009/0020745 A1* | 1/2009 | Jeong | G11C 13/003 257/4 |
| 2011/0248236 A1* | 10/2011 | Kim | G11C 13/0007 257/4 |

(Continued)

FOREIGN PATENT DOCUMENTS

KR    10-2010-0078808 A    7/2010

OTHER PUBLICATIONS

Y. Muraoka et al., "Angle-resolved photoemission spectroscopy for $VO_2$ thin films grown on $TiO_2$ (0 0 1) substrates", Journal of Electron Spectroscopy and Related Phenomena, 2010, pp. 249-251, vol. 181.

(Continued)

*Primary Examiner* — David Vu
*Assistant Examiner* — Brandon Fox

(57) ABSTRACT

The present invention relates to a variable resistance memory device and a method for forming the same. A variable resistance memory device according to the present invention includes a first electrode; a second electrode spaced apart from the first electrode; a resistance variable layer and a metal-insulator transition layer provided between the first electrode and the second electrode; and a heat barrier layer provided (i) between the first electrode and the metal-insulator transition layer, (ii) between the metal-insulator transition layer and the resistance variable layer, or (iii) between the second electrode and the metal-insulator transition layer. The present invention prevents dissipation of heat generated in the metal-insulator transition layer using a thermal boundary resistance (TBR) phenomenon, and thus current and voltage to operate the variable resistance memory device can be reduced.

23 Claims, 19 Drawing Sheets

(56) References Cited

U.S. PATENT DOCUMENTS

2013/0200326 A1* 8/2013 Ju ..................... H01L 45/08 257/4
2014/0239245 A1* 8/2014 Lengade ............. H01L 45/12 257/4

OTHER PUBLICATIONS

I-Ru Chen et al., "Compact Thermal Model for Vertical Nanowire Phase-Change Memory Cells", IEEE Transactions on Electron Devices, Jul. 2009, pp. 1523-1528, vol. 56, No. 7.

Hyun-Tak Kim et al., "Mechanism and observation of Mott transition in $VO_2$-based two- and three-terminal devices", New Journal of Physics, 2004, pp. 1-19, vol. 6, No. 52.

"CMOx, 3D Cross-point and Terabit Memories", Unity Semiconductor Corporation, Oct. 7, 2011, slides 1-33.

V Schick et al., "Temperature dependant thermal and mechanical properties of a metal-phase change layer interface using the time resolved pump probe technique", Journal of Physics: Conference Series 278, 2011, pp. 1-4.

John P. Reifenberg et al., "The Impact of Thermal Boundary Resistance in Phase-Change Memory Devices", IEEE Electron Device Letters, Oct. 2008, pp. 1112-1114, vol. 29, No. 10.

John P. Reifenberg et al., "Thermal Boundary Resistance Measurements for Phase-Change Memory Devices", IEEE Electron Device Letters, Jan. 2010, pp. 56-58, vol. 31, No. 1.

* cited by examiner

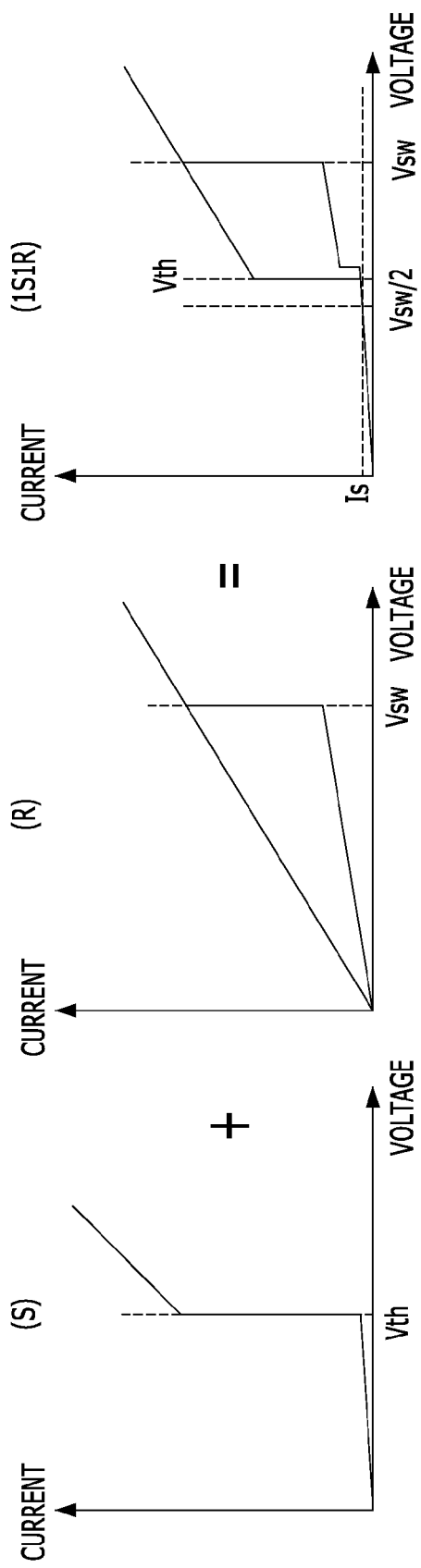

VARIABLE RESISTANCE MEMORY DEVICE

CROSS-REFERENCE TO RELATED APPLICATIONS

The present application claims priority of Korean Patent Application No. 10-2012-0137216, filed on Nov. 29, 2012, which is incorporated herein by reference in its entirety.

BACKGROUND

1. Field

Embodiments of the present invention relate to a variable resistance memory device (or a resistance variable memory device) and a method for forming the same. More particularly, embodiments of the present invention relate to a variable resistance memory device including a resistance variable layer whose electrical resistance varies according to voltage or current applied thereto, which enables a switching operation between at least two different resistance states, and a method for forming the same.

2. Description of the Related Art

A variable resistance memory device has at least two resistance states and switches its resistance state according to an external input signal such as voltage applied thereto. A variable resistance memory device stores data by performing the switching operation. Examples of variable resistance memory devices include a Resistive Random Access Memory (ReRAM), a Phase Change RAM (PCRAM), a Spin Transfer Torque-RAM (STT-RAM), etc. Many studies have been made on the variable resistance memory device due to its simple structure and superior capabilities for retaining stored data even if the external input is no longer applied.

Among the variable resistance memory devices, ReRAM may include (i) a resistance variable layer formed of, for example, a Perovskite-based material or a transitional metal oxide, and (ii) upper and lower electrodes. In the ReRAM, a filament acting as a current path is formed or broken in the resistance variable layer repeatedly depending on a voltage level applied to the electrodes.

When the filament is formed, the resistance variable layer is in a low resistance state. In contrast, when the filament is broken, the resistance variable layer is in a high resistance state. The switching operation from the high resistance state to the low resistance state, and from the low resistance state to the high resistance state are called 'set' and 'reset' operation, respectively.

SUMMARY

A variable resistance memory device and a forming method thereof according to an embodiment of the present invention reduces dissipation of heat generated in a metal-insulator transition (MIT) layer using a thermal boundary resistance (TBR) effectand results in transition of the MIT layer at lower levels of operation current and voltage than those without the TBR effect. Accordingly, levels of operation current and voltage for the variable resistance memory device can be reduced.

A variable resistance memory device according to an embodiment of the present invention may include a first electrode; a second electrode spaced apart from the first electrode; a resistance variable layer and a metal-insulator transition (MIT) layer provided between the first electrode and the second electrode; and a heat barrier layer provided (i) between the first electrode and the MIT layer, (ii) between the MIT layer and the resistance variable layer, or (iii) between the second electrode and the MIT layer.

A variable resistance memory device according to another embodiment of the present invention may include a vertical electrode vertically extending from a substrate; a plurality of interlayer insulating patterns and a plurality of horizontal electrodes which are stacked in an alternative manner in a direction to which the vertical electrode extends; a resistance variable layer and a metal-insulator transition (MIT) layer, each of which is provided between the vertical electrode and the horizontal electrodes; and a heat barrier layer provided (i) between the horizontal electrodes and the MIT layer, (ii) between the MIT layer and the resistance variable layer, or (iii) between the vertical electrode and the MIT layer.

According to embodiments of the present invention, heat dissipation from the metal-insulator transition (MIT) layer can be suppressed using a thermal boundary resistance (TBR) phenomenon and thus operation current and voltage for the variable resistance memory device can be reduced.

BRIEF DESCRIPTION OF THE DRAWINGS

FIGS. 3A-3D illustrate advantages of a variable resistance memory device according to the first embodiment of the present invention.

DETAILED DESCRIPTION

Figure 1A:
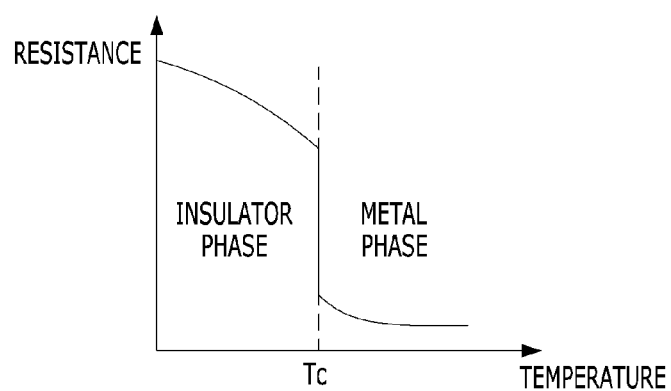
FIGS. 1A-1E illustrate various aspects of a variable resistance memory device including a metal-insulator transition layer.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

FIGS. 1A-1E show various aspects of a variable resistance memory device including a metal-insulator transition layer.

FIG. 1A shows a graph illustrating a metal-insulator transition (MIT) behavior of a material whose crystalline structure changes at a critical temperature Tc. As a result, the material undergoes transition from a metal to an insulator or vice versa, and its electrical resistance abruptly changes at the critical temperature Tc accordingly. A variable resistance memory device may employ a layer formed of a material having such MIT characteristics as a selection unit.

Figure 1B:
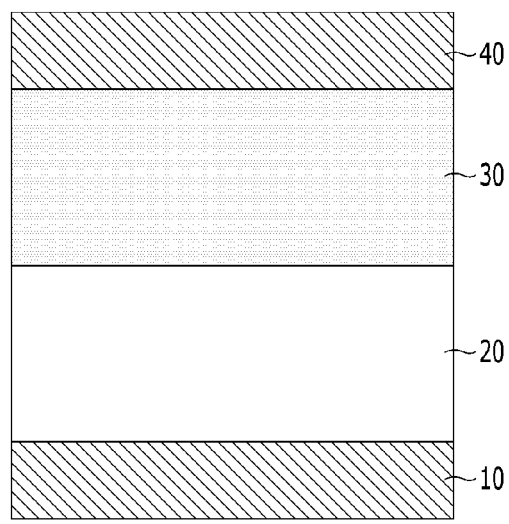

Referring to FIG. 1B, a variable resistance memory device employing a MIT layer as a selection unit may have a stacked structure including a lower electrode 10, a MIT layer 20, a resistance variable layer 30, and an upper electrode 40.

Figure 1C:
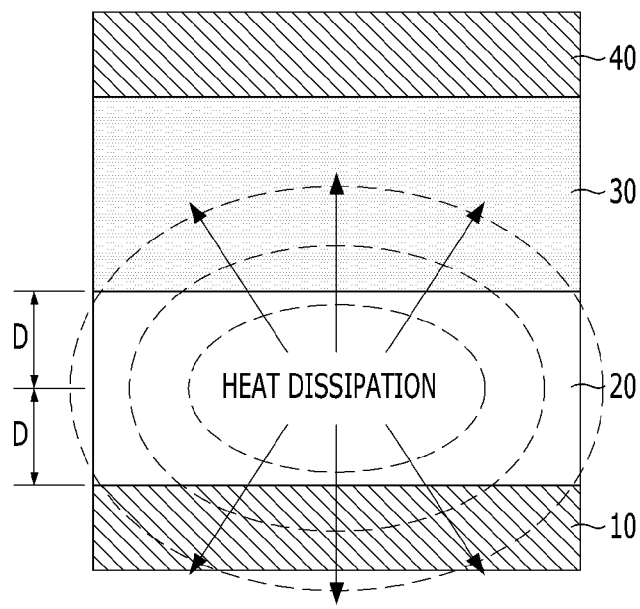

Referring to FIG. 1C, when an electric current passes through the MIT layer 20, Joule heating occurs in the MIT layer 20 and the internally generated heat is dissipated to adjacent layers, such as the lower electrode 10 and the resistance variable layer 30. Due to heat dissipation to the adjacent layers, a higher level of an electric current or voltage is required for the MIT layer 20 to reach the critical temperature Tc than in the absence of heat dissipation. When a temperature of the MIT layer reaches the critical temperature Tc, transition of the MIT layer 20 from an insulator into a metal occurs.

Figure 1D:
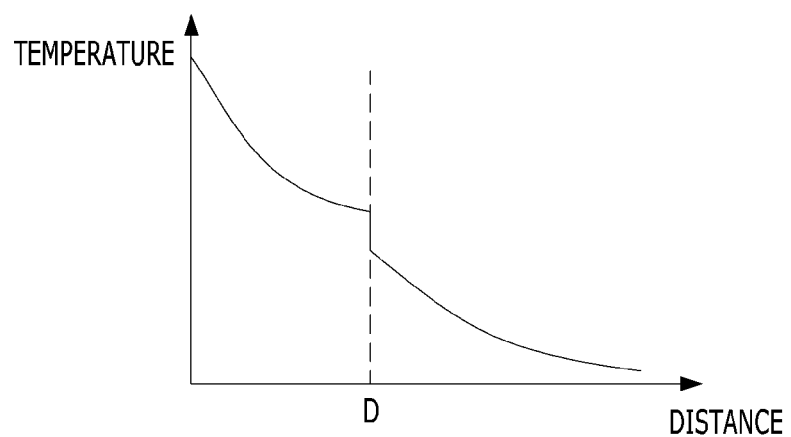

Referring to FIG. 1D, a temperature decreases when a distance from a center of the MIT layer 20 increases. The temperature drop increases in proportion to the amount of the heat dissipated to the adjacent layers. Discontinuities in the temperature distribution exist at an interface between the lower electrode 10 and the metal-insulator transition layer 20 (D) and an interface between the resistance variable layer 30 and the metal-insulator transition layer 20 (D).

Figure 1E:
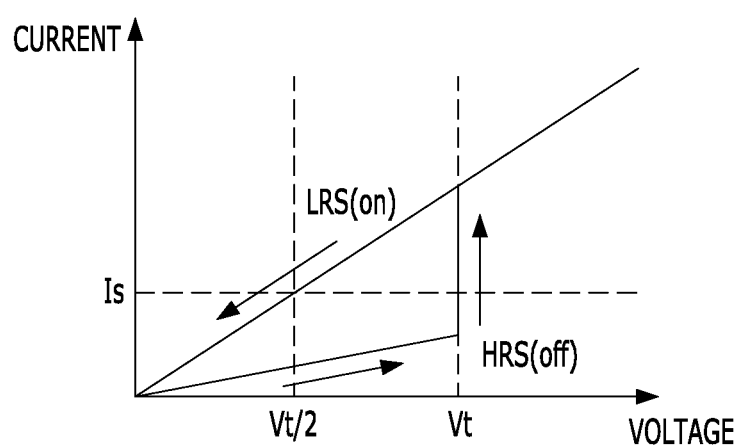

Referring to FIG. 1E, under a cross point cell array structure, memory cells are arranged at every intersection of a plurality of bit lines and a plurality of word lines. Under the cross point cell array structure, when a voltage Vt is applied to a selected cell at an intersection between a selected bit line and a selected word line, a lower voltage, which amounts to approximately a half of the voltage Vt, may be applied to unselected cells as well, causing sneak currents to flow through the unselected cells.

FIG. 1E shows a current-voltage graph of a memory cell that does not include a metal-insulator transition (MIT) layer in operation from the high resistance state (HRS) to the low resistance state (LRS). As shown in FIG. 1E, a relatively high sneak current Is may flow through an unselected memory cell to which approximately a half of the voltage Vt is applied. Thus, in order to reduce the sneak current Is, an embodiment of the present invention may employ a selection unit, such as a MIT layer, which will be explained in more detail hereinafter.

Figure 2A:
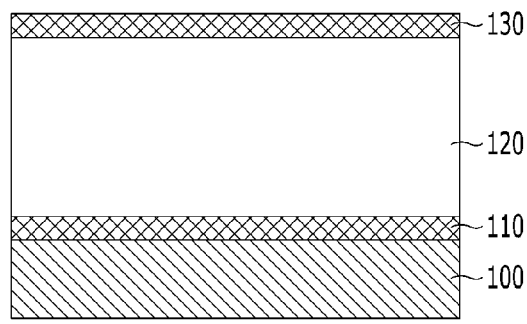
FIGS. 2A-2B show a variable resistance memory device and a method for forming the same according to a first embodiment of the present invention.
Figure 2B:
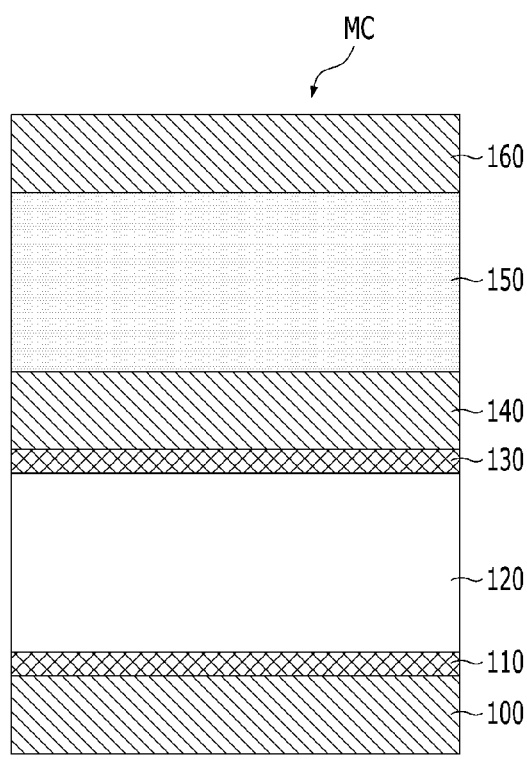

FIGS. 2A and 2B are cross-sectional views illustrating a variable resistance memory device according to a first embodiment of the present invention and a method for forming the same. FIG. 2B is a cross-sectional view of a variable resistance memory device according to the first embodiment of the present invention. FIG. 2A shows a part of the variable resistance memory device shown in FIG. 2B.

Referring to FIG. 2A, a first electrode 100 is formed over a substrate (not shown) having an underlying structure (not shown). The first electrode 100 may be formed of a conductive material. The conductive material may include metal nitride such as TiN, TaN, WN, etc., metal such as W, Al, Cu, Au, Ag, Pt, Ni, Cr, Co, Ti, Ru, Hf, Zr, etc., or doped polysilicon.

Even though not shown in FIGS. 2A and 2B, the substrate may include a peripheral circuit for driving the variable resistance memory device.

A first heat barrier 110, a metal-insulator transition (MIT) layer 120, and a second heat barrier 130 are sequentially formed over the first electrode 100. The MIT layer 120 may include a material having a crystalline structure that changes at a critical temperature so that the material transforms from an insulator into a metal or vice versa. For example, such a material may include niobium oxide (NbOx, $2 \leq x \leq 2.5$) or vanadium oxide (VOx, $2 \leq x \leq 2.5$).

Specifically, dioxides (i.e., x=2) such as $NbO_2$ and $VO_2$ are typically employed as a metal-insulator transition (MIT) material. $Nb_2O_5$ and $V_2O_5$ (i.e. x=2.5) also show metal-insulator transition properties by locally creating $NbO_2$ and $VO_2$ channels.

When currents flow through the MIT layer 120, Joule heating occurs in the MIT layer 120 to increase a temperature of the MIT layer 120, which leads to a switching at a predetermined threshold voltage. The MIT layer 120 may be used as a selection unit in a cross point cell array to effectively reduce sneak currents flowing through unselected cells.

The first and second barrier layers 110, 130 are formed to reduce dissipation of heat generated in the MIT layer 120 to adjacent layers using a thermal boundary resistance (TBR). In an embodiment, the first and second barrier layers 110, 130 may include a material whose Debye temperature is different from that of the MIT layer 120. For example, the first and the second barrier layers 110, 130 may include metal, oxide, nitride, or a combination thereof.

In an embodiment, the first and second barrier layers 110, 130 may be formed thin. For example, the first and second barrier layers may have a thickness ranging from several angstroms (Å) to several tens of angstroms (Å). In this range of thickness, the first and second barrier layers 110, 130 do not significantly inhibit electron tunneling and current flow.

The thermal boundary resistance (TBR) occurs when thermal energy carriers such as phonons and electrons are scattered at an interface between materials having different vibrational and electronic characteristics. The scattering of phonons or electrons, depending on the materials at the interface, is caused by lattice defects and other imperfections in the materials and at the interface. TBR acts as an additional thermal resistance and reduces heat transfer through the interface, resulting in temperature discontinuity at the interface.

The Debye temperature is an intrinsic thermal property of a material. The greater the difference in the thermal properties between materials at an interface is, the stronger the TBR effect becomes. When the TBR effect becomes stronger, heat dissipation from the MIT layer 120 decreases as discussed above. Thus, the greater the differences in the Debye temperatures between the first and second barrier layers 110, 130 and the MIT layer 120 are, the less heat will dissipate from the metal-insulator transition layer 120.

Referring to FIG. 2B, a third electrode 140, a resistance variable layer 150, and a second electrode 160 are formed sequentially over the second heat barrier layer 130.

The third and the second electrodes 140, 160 may include conductive materials, for example, (i) metal nitrides such as TiN, TaN, and WN, (ii) metals such as W, Al, Cu, Au, Ag, Pt, Ni, Cr, Co, Ti, Ru, Hf, Zr, etc., or (iii) doped silicon.

The resistance variable layer 150 may include material whose electrical resistance varies due to a change in oxygen vacancy, ion migration, or a phase change of the material.

In an embodiment, for example, a material having an electrical resistance value that varies due to a change in oxygen vacancy or ion migration may include (i) Perovskite-based material such as STO($SrTiO_3$), BTO($BaTiO_3$), PCMO($Pr_{1-x}Ca_xMnO_3$) etc., or (ii) oxide material including Transition Metal Oxide (TMO) such as $TiO_2$, $HfO_2$, $ZrO_2$, $Al_2O_3$, $Ta_2O_5$, Niobium oxide ($Nb_2O_5$), $Co_3O_4$, NiO, $WO_3$, lanthanum oxide ($La_2O_3$), etc.

A material having an electrical resistance value that varies due to its phase change may include a material that changes between a crystalline structure and an amorphous structure, such as Chalcogenide material. For example, GST (GeSbTe), where germanium, antimony, and tellurium are combined with a given ratio, may be employed.

According to the descriptions above, a variable resistance memory device according to the first embodiment of the present invention as shown in FIG. 2B may be obtained.

Referring to FIG. 2B, a unit memory cell (MC) of the variable resistance memory device according to the first embodiment of the present invention may have a stacked structure of the first electrode 100, the first heat barrier layer 110, the MIT layer 120, the second heat barrier layer 130, the third electrode 140, the resistance variable layer 150, and the second electrode 160.

The MIT layer 120 may include a material whose electrical resistance value abruptly changes at a critical temperature, for example, niobium oxide (NbOx, $2 \leq x \leq 2.5$) and vanadium oxide (VOx, $2 \leq x \leq 2.5$).

The resistance variable layer 150 may include a material having an electrical resistance value that varies depending on a change in oxygen vacancy, ion migration, or a phase change of the material.

The first and second heat barrier layers 110, 130 may include a material whose Debye temperature is different from that of the MIT layer 120. For example, the first and the second barrier layers 110, 130 may include metal, oxide, nitride, or a combination thereof, and may have a thickness ranging from several angstroms (Å) to several tens of angstroms (Å).

FIGS. 3A-3D illustrate advantages of a variable resistance memory device according to the first embodiment of the present invention.

Figure 3A:
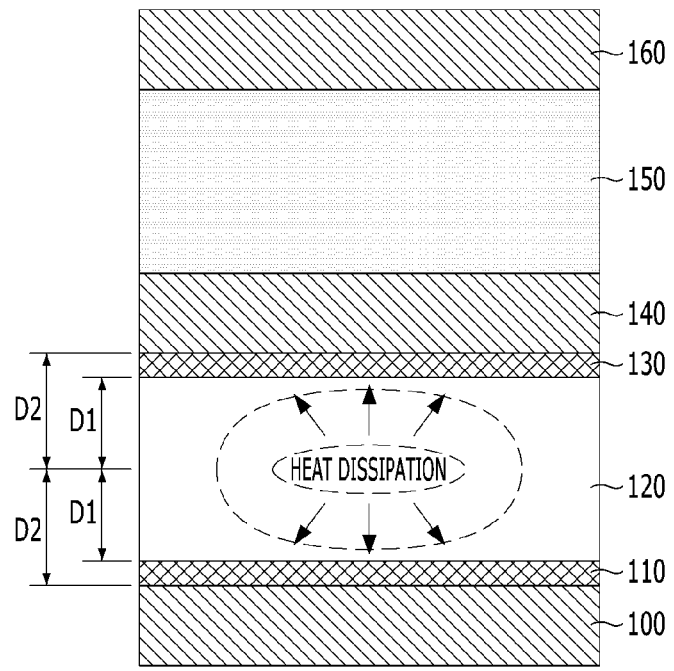
Figure 3B:
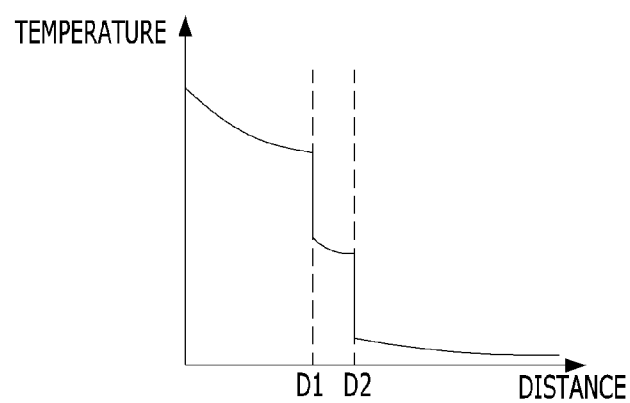

Referring to FIGS. 3A and 3B, using thermal boundary resistance (TBR), the first and second heat barrier layers 110, 130 can effectively reduce dissipation of heat generated in the MIT layer 120 by Joule heating to adjacent layers.

The graph shown in FIG. 3B illustrates temperature distribution as a function of the distance from the center of the MIT layer 120. The temperature changes continuously within the MIT layer 120, while there is a discontinuity in temperature change at interfaces (i) between the MIT layer 120 and the first or second heat barrier layers 110, 130 (D1), and (ii) between the first heat barrier layer 110 and the first electrode 100 (D2) and between the second heat barrier layer 130 and the third electrode 140 (D2).

Referring to FIG. 3C according to an embodiment of the present invention, the graph shows currents as a function of voltages applied to three different memory cells. Each of the three currents on the graph represents current changes in a memory cell having an MIT layer (S), a memory cell having a resistance variable layer (R), and a memory cell having both an MIT layer and a resistance variable layer (1S1R), respectively. The memory cell having the MIT layer (S) has a high resistance value (i.e., a low slope, as shown by (S)) until the applied voltage reaches a threshold voltage Vth, and then a low resistance value (i.e., a high slope in (S)). Meanwhile, the memory cell having the resistance variable layer (R) is changed from the high resistance state to the low resistance state or vice versa when a voltage Vsw is applied. Accordingly, the memory cell including both the MIT layer and the resistance variable layer (1S1R), which are coupled in series, has a very high resistance value until the applied voltage reaches the threshold voltage Vth, and then moderate resistance values, because its total resistance value is in proportion to the sum of the resistance values of the MIT layer (S) and the resistance variable layer (R).

As described above, under a cross point cell array structure, when a voltage Vsw is applied to a selected cell, a lower voltage, which amounts to approximately a half of the voltage (Vsw/2), may be applied to unselected cells. As a result, sneak currents may flow through the unselected cells.

In a resistance variable memory cell according to an embodiment of the present invention, however, the MIT layer (S) employed in the resistance variable memory cell (1S1R), performs a switching operation at a predetermined threshold voltage Vth having a level that is higher than the half of the voltage (Vsw/2) applied to the selected cell. As described above, the MIT layer has a high resistance value below the threshold voltage Vth. Thus, currents of the memory cell (1S1R) corresponding to a voltage level less than the threshold voltage Vth are much smaller than those of a memory cell having only the resistance variable layer (R). As a result, sneak currents Is through the unselected cells in the memory cell (1S1R) having the MIT layer and the resistance variable layer can be significantly reduced.

Figure 3D:
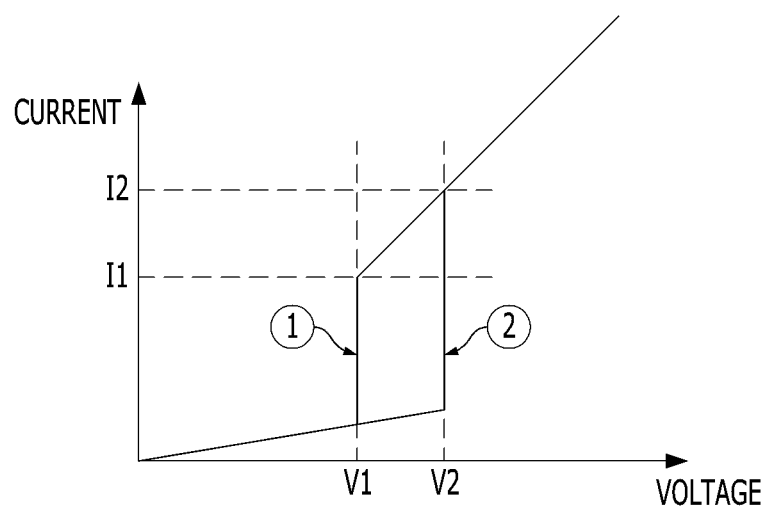

Referring to FIG. 3D, the graph shows currents as a function of voltages applied to the MIT layer. In the graph, ① represents an embodiment of the present invention including a heat barrier layer, and ② represents a memory cell without a heat barrier layer.

Due to thermal dissipation, higher levels of current and voltage I2, V2 are required for an MIT layer without a heat barrier layer to reach a critical temperature at which transition of the MIT layer from an insulator to a metal occurs than those (I1, V1) required for an MIT layer having a heat barrier layer to reach the critical temperature. Accordingly, higher levels of current and voltage I2, V2 are required for a memory cell without a heat barrier layer than for a memory cell with a heat barrier layer.

FIGS. 4A-4E are cross-sectional views illustrating variable resistance memory devices according to second through sixth embodiments of the present invention. Hereinafter, a detailed description of elements that have already been discussed may be omitted, to avoid duplicate explanation.

Figure 4A:
FIGS. 4A-4E show cross-sections of variable resistance memory devices according to second to sixth embodiments of the present invention, respectively.

Referring to FIG. 4A, a unit memory cell (MC) of a resistance variable memory cell according to the second embodiment of the present invention may include a stacked structure where a first electrode 100, a resistance variable layer 150, a third electrode 140, a first heat barrier layer 110, a metal-insulator transition layer 120, a second heat barrier layer 130, and a second electrode 160 are sequentially stacked.

That is, the first heat barrier layer 110, the MIT layer 120, and the second heat barrier layer 130 are provided over the resistance variable layer 150 and the third electrode 140. In particular, under a cross point cell array structure where upper and lower memory cells (MC) share a wire line, one of the upper and lower memory cells (MC) may be configured in the stacked structure shown in the first embodiment (see FIG. 2B). The other of the upper and lower memory cells (MC) may be configured in a stacked structure shown in the second embodiment of the present invention (see FIG. 4A), so that the one stacked structure is disposed over the other stack structure, with the shared wire line interposed therebetween.

Figure 4B:
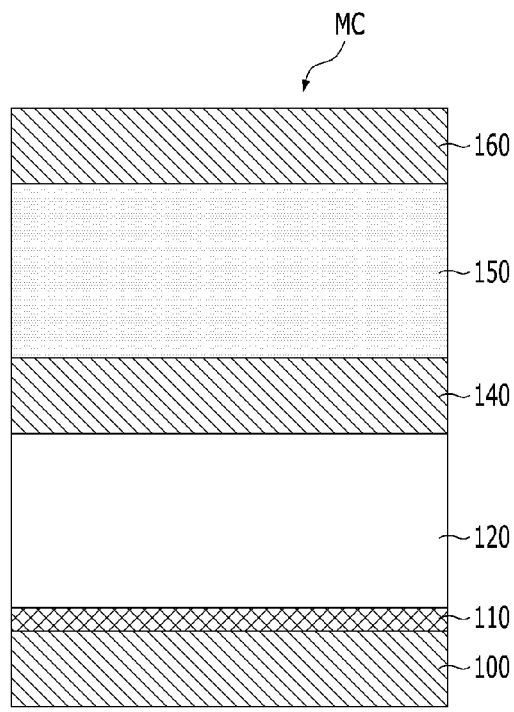

Referring to FIG. 4B, a unit memory cell (MC) of a resistance variable memory cell according to the third embodiment of the present invention may include a stacked structure where a first electrode 100, a first heat barrier layer 110, a metal-insulator transition (MIT) layer 120, a third electrode 140, a resistance variable layer 150, and a second electrode 160 are sequentially stacked.

Figure 4C:
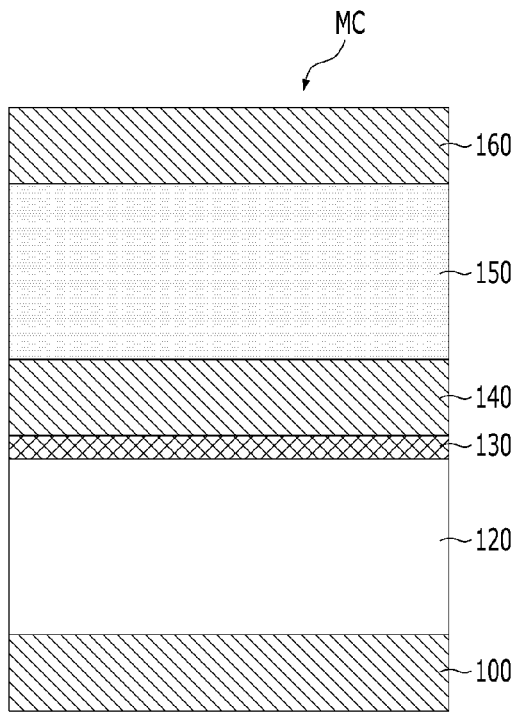

Referring to FIG. 4C, a unit memory cell (MC) of a resistance variable memory cell according to the fourth embodiment of the present invention may include a stacked structure where a first electrode 100, a metal-insulator transition (MIT) layer 120, a second heat barrier layer 130, a third electrode 140, a resistance variable layer 150, and a second electrode 160 are sequentially stacked.

In the third and fourth embodiments, one of the first and second heat barrier layers 110, 130 shown in the first embodiment may be omitted. Moreover, in combination therewith, the stacking order of the layers in the third and fourth embodiments can be changed, for example, as shown in the second embodiment.

Figure 4D:
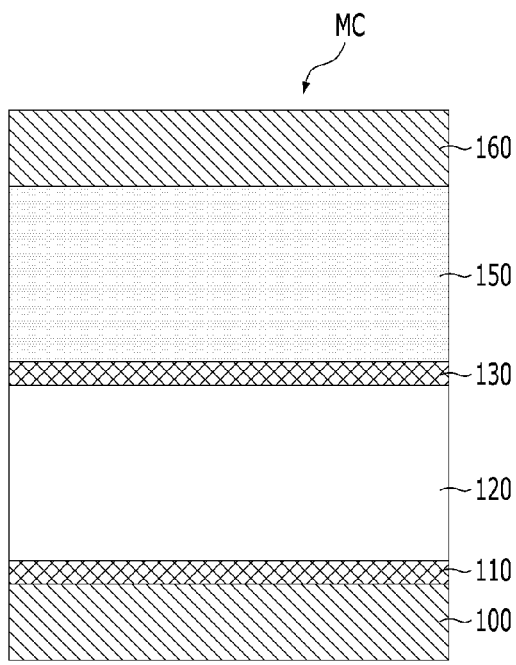

Referring to FIG. 4D, a unit memory cell (MC) of a resistance variable memory cell according to the fifth embodiment of the present invention may include a stacked structure where a first electrode 100, a first heat barrier layer 110, a metal-insulator transition (MIT) layer 120, a second heat barrier layer 130, a resistance variable layer 150, and a second electrode 160 are sequentially stacked.

That is, in the fifth embodiment, the third electrode 140 of the first embodiment may be omitted. Moreover, in combination therewith, the stacking order of the layers in the fifth embodiment may be changed.

Figure 4E:
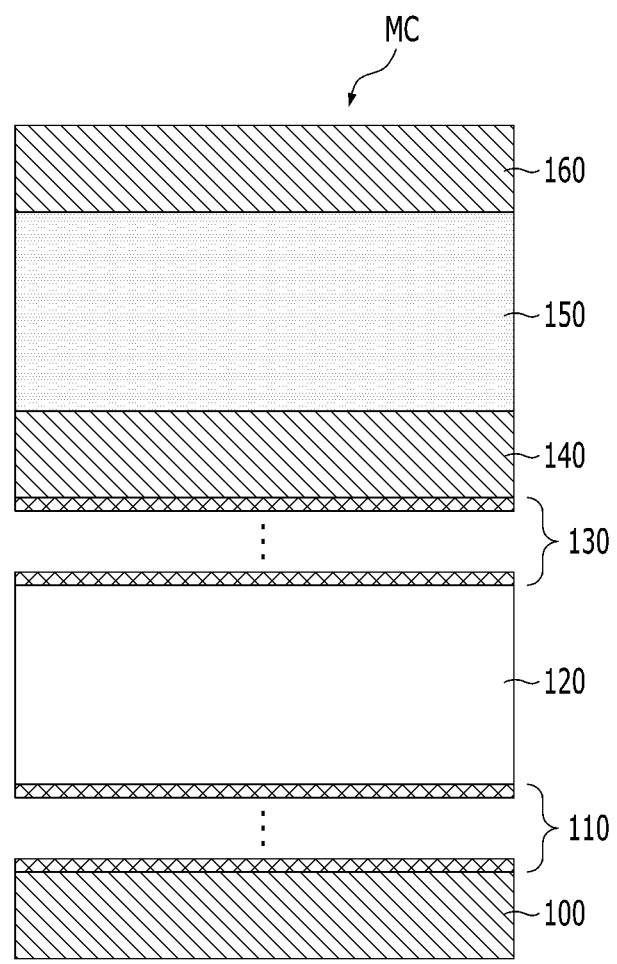

Referring to FIG. 4E, a unit memory cell (MC) of a resistance variable memory cell according to the sixth embodiment of the present invention may include a stacked structure where a first electrode 100, a first heat barrier layer 110, a metal-insulator transition (MIT) layer 120, a second heat barrier layer 130, a third electrode 140, a resistance variable layer 150, and a second electrode 160 are sequentially stacked. Each of the first and second heat barrier layers 110, 130 comprise a plurality of layers. In an embodiment, at least one of the plurality of layers may be formed of a different material having a Debye temperature that is different, to enhance the thermal boundary resistance (TBR) effect. In addition, the stacking order of the sixth embodiment may be changed.

Figure 5:
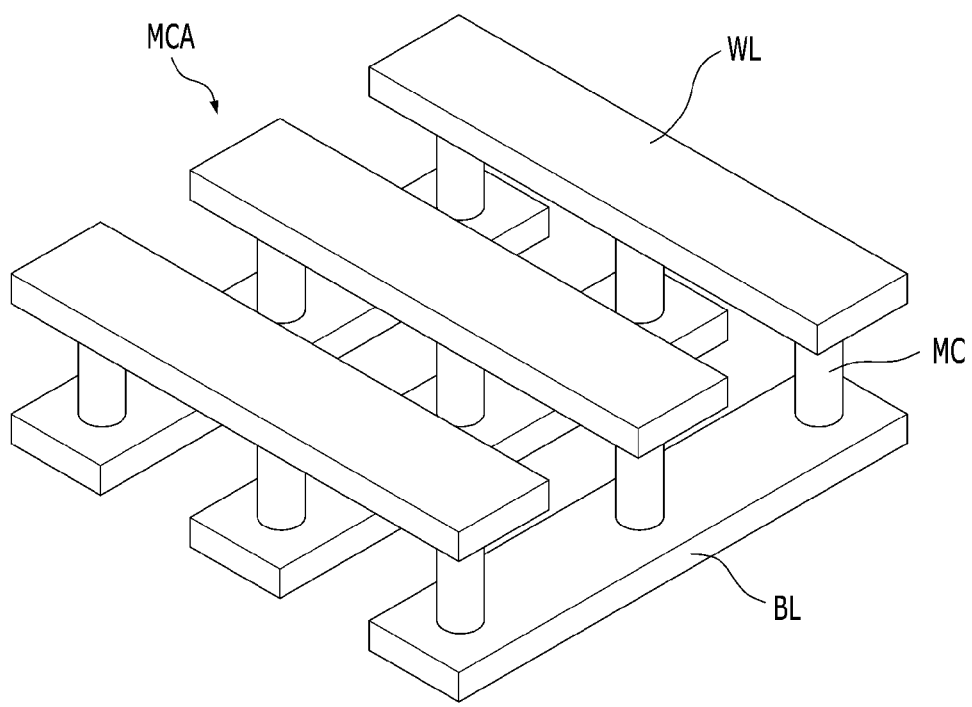
FIG. 5 is a perspective view of a memory cell array (MCA) of a variable resistance memory device according to an embodiment of the present invention.

FIG. 5 is a perspective view of a memory cell array (MCA) of a variable resistance memory device according to an embodiment of the present invention.

Referring to FIG. 5, memory cells (MC) of a resistance variable memory cell according to an embodiment of the present invention are arranged in a cross point cell array configuration. Under the cross point cell array configuration, the memory cells are arranged at intersections of a plurality of parallel bit lines BL and a plurality of parallel word lines WL. Each memory cell includes a resistance variable layer, which undergoes a resistance change in response to a voltage or a current applied to the memory cell, so that a switching operation between at least two different resistance states occurs.

Figure 6A:
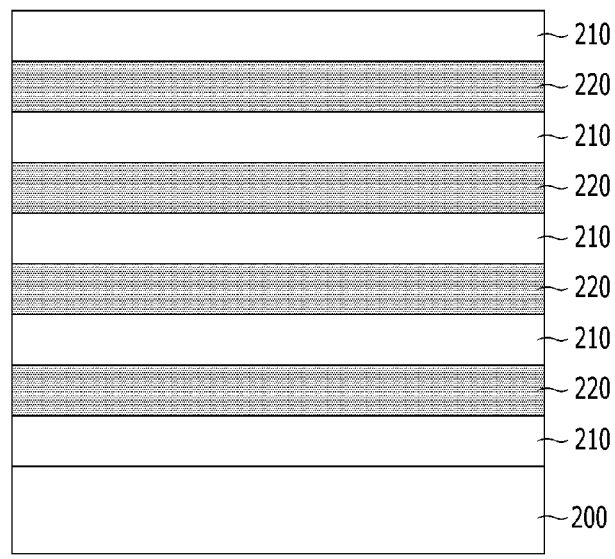
FIGS. 6A-6F show a variable resistance memory device according to a seventh embodiment of the present invention and a method for forming the same.
Figure 6B:
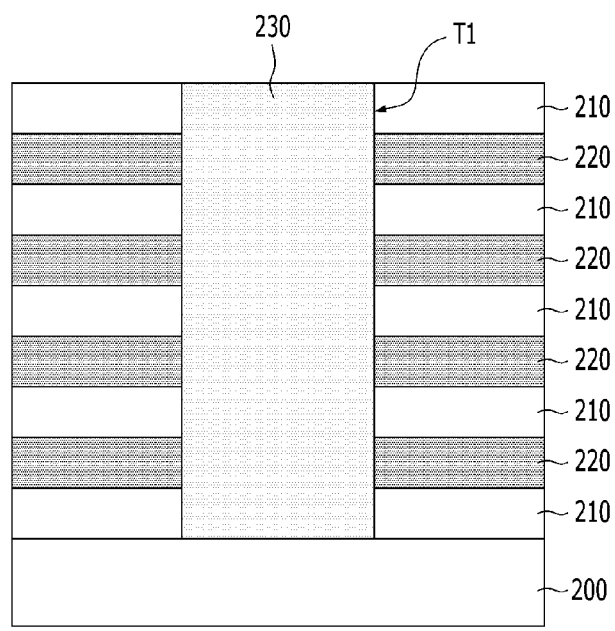
Figure 6C:
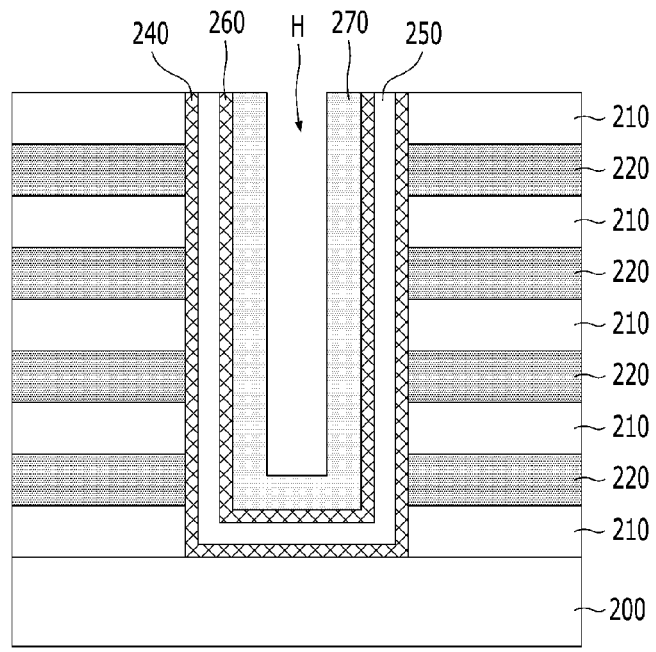
Figure 6D:
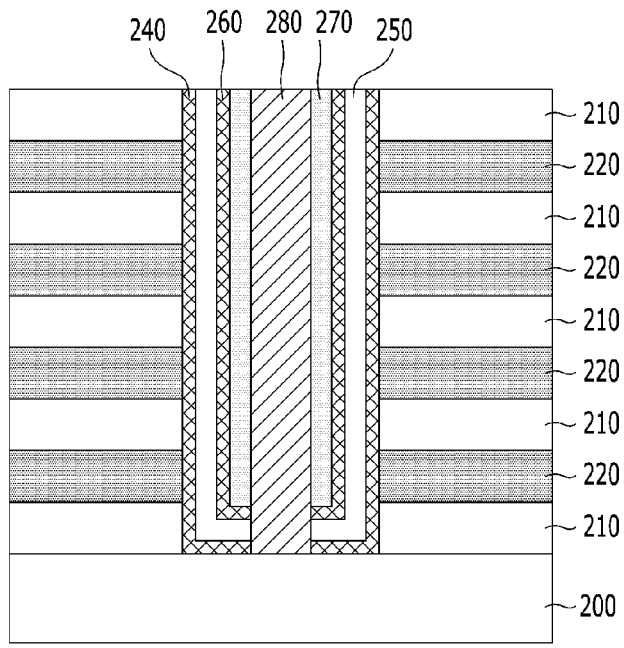
Figure 6E:
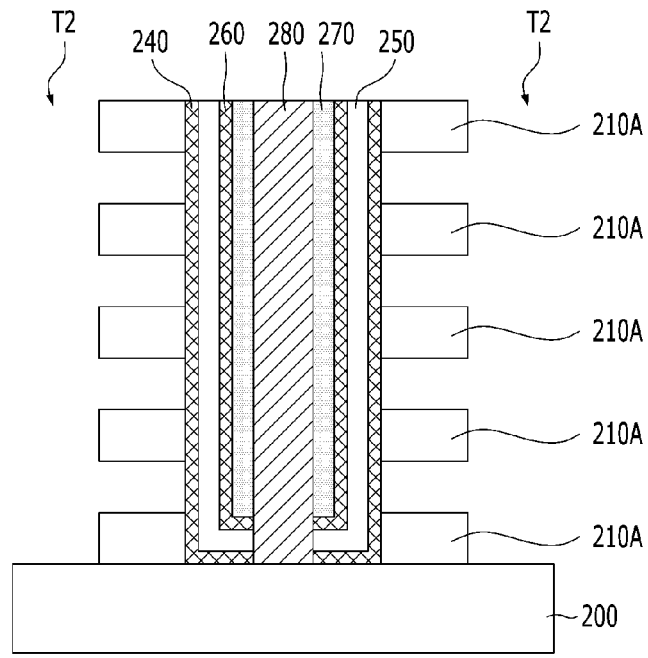
Figure 6F:
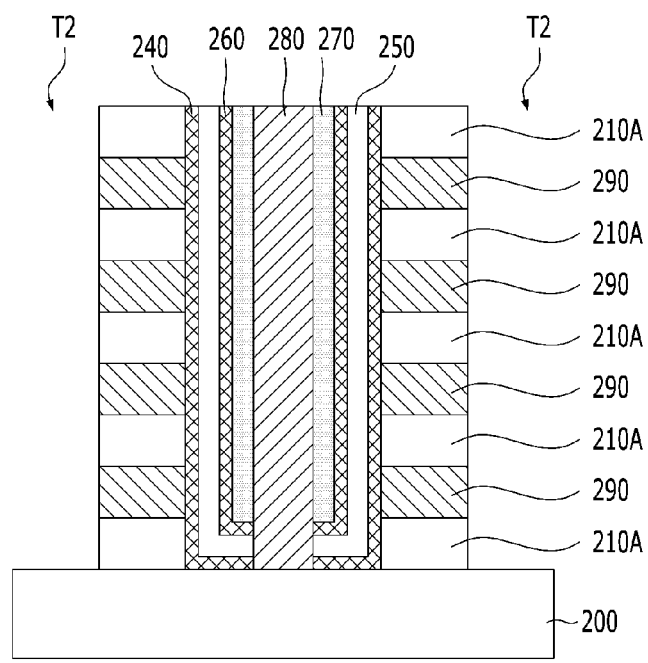

FIGS. 6A-6F show cross-sectional views illustrating a variable resistance memory device according to a seventh embodiment of the present invention and a method for forming the same. FIG. 6F shows a cross-sectional view illustrating a variable resistance memory device according to the seventh embodiment of the present invention. FIGS. 6A-6E show a method for forming a device in accordance with the seventh embodiment of the present invention. Hereinafter, descriptions of elements that have already been explained will be omitted.

Referring to FIG. 6A, a plurality of interlayer insulating layers 210, and a plurality of sacrificial layers 220 are stacked alternately over a substrate 200 and an underlying structure (not shown). That is, the plurality of insulating layers 210 and the plurality of sacrificial layers 220 are provided so that alternating layers of an insulating layer 210 and a sacrificial layer 220 are stacked over the substrate. In an embodiment, the substrate 200 may be a semiconductor substrate such as single crystal silicon and the interlayer insulating layer 210 may be formed of an oxide-based material.

The sacrificial layers 220 will be removed in a subsequent process to create room for horizontal electrodes 290 (see FIG. 6F) and may be formed of material which has a different wet etching selectivity from that of the interlayer insulating layers 210. For example, the sacrificial layers 220 may be formed of a nitride-based material.

In FIG. 6A, four sacrificial layers 220 are shown but embodiments of the present invention are not limited thereto. Thus, in another embodiment, the number of sacrificial layers 220 may be different.

Referring to FIG. 6B, using a line-type mask (not shown), which extends in a line along a given direction, as an etching mask, the interlayer insulating layers 210 and the sacrificial layers 220 are etched to form a first slit T1. The first slit T1 is filled with an insulating layer 230. In an embodiment, a plurality of first slits T1 may be formed. In an embodiment, the plurality of first slits T1 may be parallel to each other. The insulating layer 230 may be formed of material whose wet etching selectivity is different from that of the sacrificial layer 220. For example, the insulating layer 230 may be formed of an oxide-based material.

Referring to FIG. 6C, the insulating layer 230 is selectively etched to form a hole H exposing a surface of the substrate 200 and a sidewall of the sacrificial layers 220. In an embodiment, a plurality of holes H may be formed in a matrix pattern. When viewed from the top, the hole H may be in a square, circle, rectangular, or oval shape.

A first heat barrier layer 240, a metal-insulator transition (MIT) layer 250, a second heat barrier layer 260, and a resistance variable layer 270 are sequentially formed in the hole H. In an embodiment, the first heat barrier layer 240, the MIT layer 250, the second heat barrier layer 260, and the resistance variably layer 270 are formed conformally over the sidewalls and the bottom of the hole H.

The MIT layer 250 may include a material which transforms from an insulator into a metal or vice versa at a critical temperature, and thus its electrical resistance abruptly changes at the critical temperature. For example, the MIT layer 250 may be formed of any of niobium oxide (NbOx, $2 \leq x \leq 2.5$) and vanadium oxide (VOx, $2 \leq x \leq 2.5$).

The resistance variable layer 270 may include a material having an electrical resistance value that varies depending on a change in oxygen vacancy, ion migration, or a phase change of the material.

The first and second heat barrier layers 240, 260 are formed to reduce dissipation of heat generated in the MIT layer 250 by Joule heating, using the thermal boundary resistance (TBR) effect, and may include a material whose Debye temperature is different from that of the MIT layer 250. For example, the first and second heat barrier layers 240, 260 may include metal, oxide, nitride, or a combination thereof.

The first and the second heat barrier layers 240, 260 may be formed thin. In an embodiment, the first and second heat barrier layers 240, 260 may have a thickness ranging from several angstroms (Å) to several tens of angstroms (Å). In another embodiment, one of the first and second heat barrier layers 240, 260 may not be formed.

Referring to FIG. 6D, a portion of the first heat barrier layer 240, the metal-insulator transition layer 250, the second heat barrier layer 260, and the resistance variable layer 270 at the bottom of the hole H are etched to expose the substrate 200. Subsequently, the hole H is filled with a conductive material to form a vertical electrode 280. The conductive material, for example, may include (i) metal nitrides such as TiN, TaN, and WN, (ii) metals such as W, Al, Cu, Au, Ag, Pt, Ni, Cr, Co, Ti, Ru, Hf, Zr, etc., or (iii) doped silicon.

Referring to FIG. 6E, using a line-type mask pattern, which extends along a line in the same direction as the first slit T1, as an etching mask, portions of the interlayer insulating layers 210 and the sacrificial layers 220 disposed distal to a side of the hole H are etched to form a second slit T2. Subsequently, the sacrificial layers 220 exposed by the slit T2 are removed. In an embodiment, a plurality of second slits T2 may be formed. In an embodiment, the plurality of second slits T2 may be arranged in parallel to each other. The sacrificial layers 220 may be removed by a wet etching process using a different etching selectivity of the sacrificial layers 220 from that of the interlayer insulating layers 210. Hereinafter, the remaining interlayer insulating layers 210 will be referred to as a plurality of interlayer insulating patterns 210A.

Referring to FIG. 6F, horizontal electrodes 290 are formed where the sacrificial layers 220 have been removed. The horizontal electrodes 290 may be formed of conductive material, for example, (i) metal nitride such as TiN, TaN, and WN, (ii) metal such as W, Al, Cu, Au, Ag, Pt, Ni, Cr, Co, Ti, Ru, Hf, Zr, etc., or (iii) doped silicon.

The horizontal electrods 290 may be formed using Chemical Vapor Deposition (CVD), Atomic Layer Deposition (ALD), etc. The conductive material may be conformally deposited, so that the conductive material can form a horizontal electrode layer (not shown) in the regions where the sacrificial layers 220 have been removed. The horizontal electrode layer is etched until a sidewall of the interlayer insulating patterns 210A is exposed, thereby forming the horizontal electrodes 290, which are separated from each other by the interlayer insulating patterns 210A.

According to the method described above, a variable resistance memory device as shown in FIG. 6F according to the seventh embodiment of the present invention may be obtained.

Referring to FIG. 6F, the variable resistance memory device according to the seventh embodiment of the present invention may include a vertical electrode 280 vertically extending from a substrate 200 and a plurality of interlayer insulating patterns 210A and a plurality of horizontal electrodes 290 which are stacked so that they alternate in a direction along which the vertical electrode 280 extends. A variable resistance memory device according to the seventh embodiment further includes a resistance variable layer 270 and a metal-insulator transition (MIT) layer 250 disposed between the vertical electrode 280 and the horizontal electrodes 290, a first heat barrier layer 240 interposed between the horizontal electrodes 290 and the MIT layer 250, and a second heat barrier layer 260 interposed between the MIT layer 250 and the resistance variable layer 270.

The MIT layer 250 may include a material whose electrical resistance value abruptly changes at a critical temperature. The material, for example, may include any of niobium oxide (NbOx, 2≤x≤2.5) and vanadium oxide (VOx, 2≤x≤2.5). The resistance variable layer 270 may include a material whose electrical resistance varies depending on a change in oxygen vacancy, ion migration, or a phase change of the material.

The first and second heat barrier layers 240, 260 may include a material whose Debye temperature is different from that of the MIT 250. For example, the first and the second heat barrier layers 240, 260 may include metal, oxide, nitride, or a combination thereof. The first and the second heat barrier layers 240, 260 may have a thickness ranging from several angstroms (Å) to several tens of angstroms (Å). In an embodiment, the first and second heat barrier layers 240, 260 may be formed of a plurality of layers.

The vertical electrode 280 and the horizontal electrodes 290 may cross each other. At least one of an upper end or a lower end of the vertical electrode 280 may be coupled to a wire line (not shown).

Figure 7:
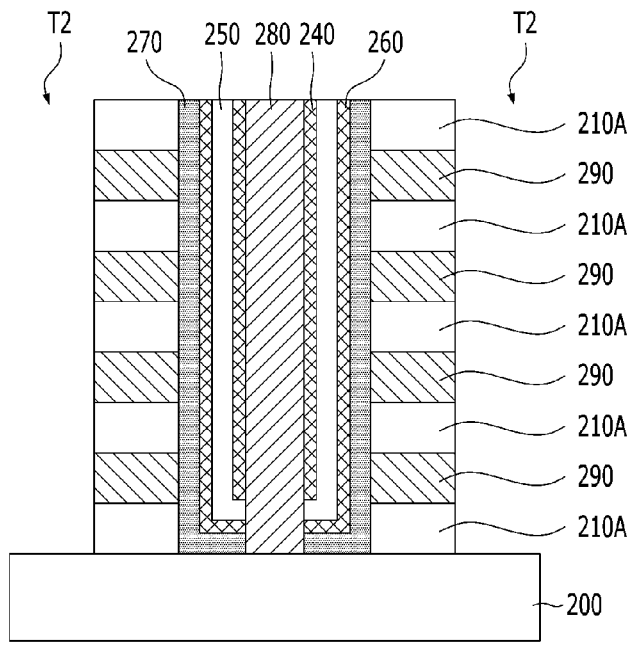
FIG. 7 shows a variable resistance memory device according to an eighth embodiment of the present invention and a method for forming the same.

FIG. 7 shows a variable resistance memory device according to an eighth embodiment of the present invention and a method for forming the same. Hereinafter, descriptions of elements explained in the seventh embodiment will be omitted.

Referring to FIG. 7, a variable resistance memory device according to the eighth embodiment of the present invention may include a vertical electrode 280 vertically extending from a substrate 200, a plurality of interlayer insulating patterns 210A and a plurality of horizontal electrodes 290 which are stacked so that they alternate in a direction along which the vertical electrode 280 extends, a resistance variable layer 270 and a metal-insulator transition (MIT) layer 250 which are disposed between the vertical electrode 280 and the horizontal electrodes 290, a first heat barrier layer 240 interposed between the vertical electrodes 280 and the MIT layer 250, and a second heat barrier layer 260 interposed between the MIT layer 250 and the resistance variable layer 270.

That is, in the eighth embodiment, the resistance variable layer 270, the second heat barrier layer 260, the MIT layer 250, and the first heat barrier layer 240 are sequentially formed. As such, the order in which layers are provided to fill the hole H is different than in the seventh embodiment (see FIG. 6F). In another embodiment, one of the first and second heat barrier layers 240, 260 may not be formed.

Figure 8:
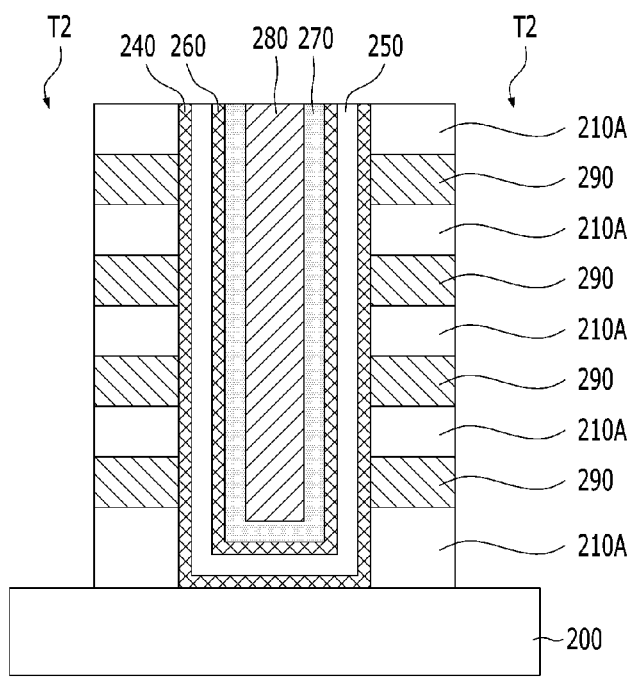
FIG. 8 shows a variable resistance memory device according to a ninth embodiment of the present invention and a method for forming the same.

FIG. 8 shows a variable resistance memory device according to a ninth embodiment of the present invention and a method for forming the same. Hereinafter, descriptions of elements explained in the seventh embodiment will be omitted.

Referring to FIG. 8, a variable resistance memory device according to the ninth embodiment of the present invention may include a vertical electrode 280 vertically extending with respect to a substrate 200, a plurality of interlayer insulating patterns 210A and a plurality of horizontal electrodes 290 which are stacked so that they are alternately provided in a direction along which the vertical electrode 280 extends, a resistance variable layer 270 and a metal-insulator transition (MIT) layer 250 which are disposed between the vertical electrode 280 and the horizontal electrodes 290, a first heat barrier layer 240 interposed between the horizontal electrodes 290 and the metal-insulator transition layer 250, and a second heat barrier layer 260 interposed between the MIT layer 250 and the resistance variable layer 270.

In the ninth embodiment, bottom portions of the resistance variable layer 270, the second heat barrier layer 260, the MIT layer 250, and the first heat barrier layer 240 are not etched. That is, the resistance variable layer 270, the second heat barrier layer 260, the MIT layer 250, and the first heat barrier layer 240 remain below the bottom surface of the vertical electrode 280. Thus, the resistance variable layer 270 is not damaged in the course of etching the region ultimately provided below the vertical electrode 280, as described in the seventh embodiment. In the ninth embodiment, a wire line (not shown) is arranged at an upper portion of the vertical electrode 280. In another embodiment, one of the first and second heat barrier layers 240, 260 may be omitted.

Figure 9:
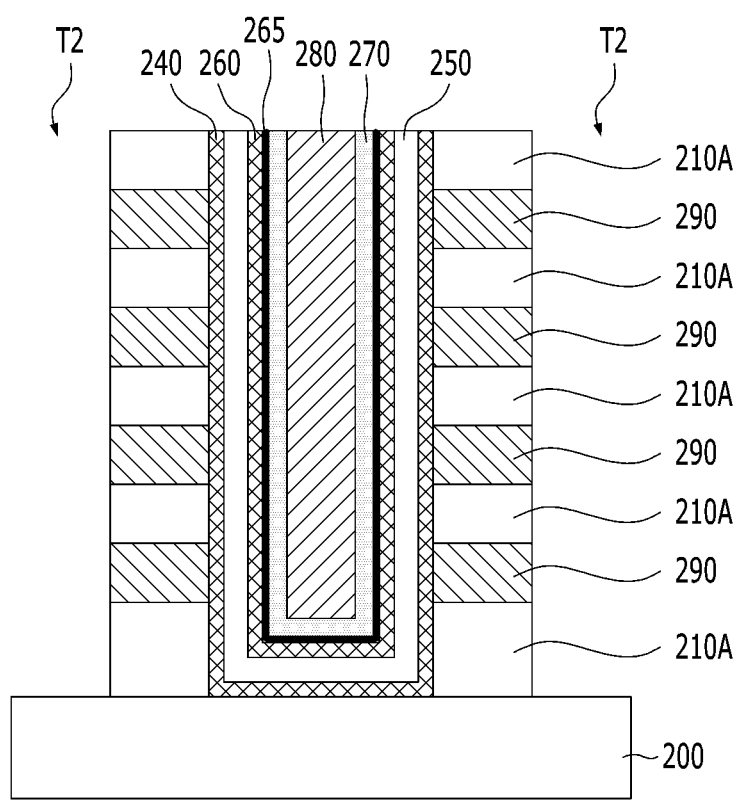
FIG. 9 shows a variable resistance memory device according to a tenth embodiment of the present invention and a method for forming the same.

FIG. 9 shows a variable resistance memory device according to a tenth embodiment of the present invention and a method for forming the same. Hereinafter, descriptions of elements explained in the seventh embodiment will be omitted.

Referring to FIG. 9, a variable resistance memory device according to the tenth embodiment of the present invention may include a vertical electrode 280 vertically extending from a substrate 200, a plurality of interlayer insulating patterns 210A and a plurality of horizontal electrodes 290 which are stacked so that they alternate in a direction along which the vertical electrode 280 extends, a resistance variable layer 270 and a metal-insulator transition (MIT) layer 250 which are disposed between the vertical electrode 280 and the horizontal electrodes 290, an intermediate electrode 265 interposed between the resistance variable layer 270 and the MIT layer 250, a first heat barrier layer 240 interposed between the horizontal electrodes 290 and the MIT layer 250, and a second heat barrier layer 260 interposed between the MIT layer 250 and the resistance variable layer 270.

That is, in the tenth embodiment, the intermediate electrode 265 may be disposed between the resistance variable layer 270 and the MIT transition layer 250. In another embodiment, one of the first and the second heat barrier layers 240, 260 may be omitted.

FIGS. 10A-10D show a variable resistance memory device according to an eleventh embodiment of the present invention and a method for forming the same. Hereinafter, descriptions of elements explained in the seventh embodiment will be omitted. After the process shown in FIG. 6A is performed, the following processes may be performed to form the structure shown in FIG. 10A.

Figure 10A:
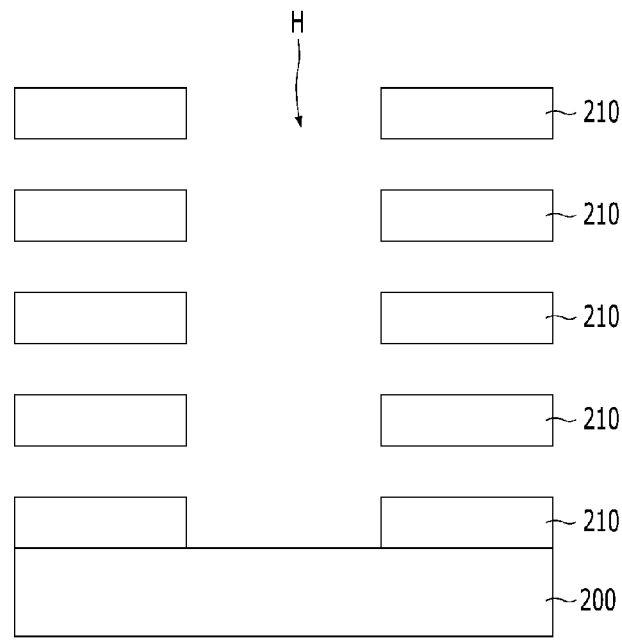
FIGS. 10A-10D show a variable resistance memory device according to an eleventh embodiment of the present invention and a method for forming the same.

Referring to FIG. 10A, a plurality of interlayer insulating layers 210 and a plurality of sacrificial layers 220 (not shown) are selectively etched to form a hole H, thereby exposing a sidewall of the sacrificial layers 220 (not shown). Then, the exposed sacrificial layer 220 is removed using the different etching selectivity of the sacrificial layers 220 from that of the interlayer insulating layers 210. In an embodiment, a plurality of holes H may be formed. In that case, the plurality of holes H may be arranged in a matrix pattern. When viewed from the top, the hole H may be formed in square, circle, rectangular, or oval shape.

Figure 10B:
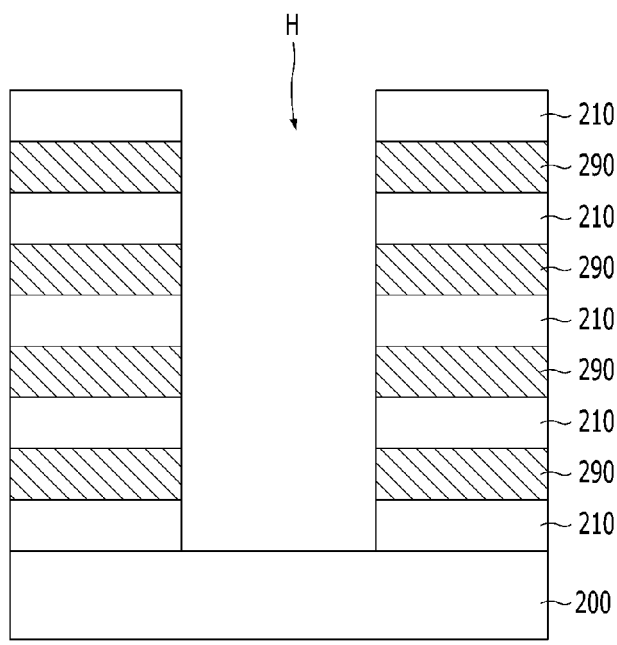

Referring to FIG. 10B, horizontal electrodes 290 are formed in the areas where the sacrificial layers 220 have been removed. The horizontal electrodes 290 may be formed of a conductive material, for example, (i) metal nitride such as TiN, TaN, and WN, (ii) metal such as W, Al, Cu, Au, Ag, Pt, Ni, Cr, Co, Ti, Ru, Hf, Zr, etc., or (iii) doped silicon.

Figure 10C:
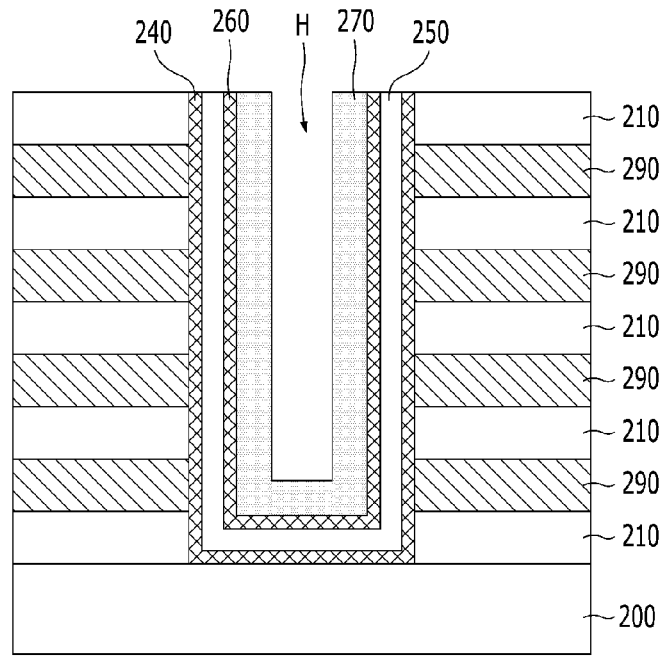

Referring to FIG. 10C, the first heat barrier layer 240, the MIT layer 250, the second heat barrier layer 260, and the resistance variable layer 270 are sequentially formed over an inner wall of the hole H.

The MIT layer 250 may include a material whose electrical resistance value abruptly changes at a critical temperature, for example, niobium oxide (NbOx, $2 \leq x \leq 2.5$) and vanadium oxide (VOx, $2 \leq x \leq 2.5$). The resistance variable layer 270 may include a material whose electrical resistance value varies depending on a change in oxygen vacancy, ion migration, or a phase change of the material.

The first and second heat barrier layers 240, 260 may include materials having Debye temperatures that are different from that of the metal-insulator transition layer 250. For example, the first and second heat barrier layers 240, 260 may be formed of metal, oxide, nitride, or a combination thereof. In an embodiment, the first and second barrier layers 240, 260 may have a thickness ranging from several angstroms (Å) to several tens of angstroms (Å). In another embodiment, one of the first and second heat barrier layers 240, 260 may be omitted.

Figure 10D:
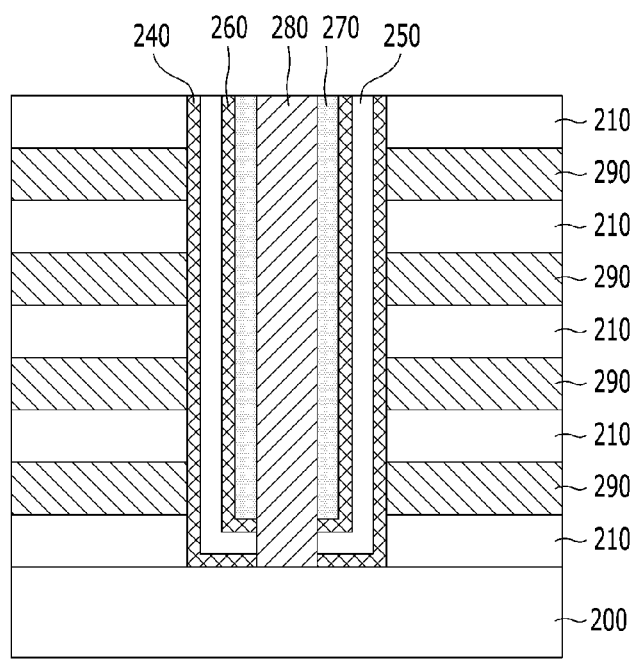

Referring to FIG. 10D, a region at the bottom of the hole H including the first heat barrier layer 240, the MIT layer 250, the second heat barrier layer 260, and the resistance variable layer 270 is etched to expose a corresponding region of the substrate 200. Subsequently, the vertical electrode 280 is formed in the hole H.

The vertical electrode 280 may be formed of a conductive material, for example, (i) metal nitride such as TiN, TaN, and WN, (ii) metal such as W, Al, Cu, Au, Ag, Pt, Ni, Cr, Co, Ti, Ru, Hf, Zr, etc., or (iii) doped silicon.

In the tenth embodiment, a lower end of the vertical electrode 280 penetrates the resistance variable layer 270, the second heat barrier layer 260, the metal-insulator transition layer 250, and the first heat barrier layer 240, but the present invention is not limited to such a structure. For example, the vertical electrode 280 may not penetrate these layers, as shown in the ninth embodiment.

In the eleventh embodiment, unlike the seventh embodiment, the horizontal electrodes 290 are not separated by the second slit T2 (see FIG. 6F). Thus, the horizontal electrodes 290 may be formed in a plate form rather than in a plurality of line forms.

Figure 11:
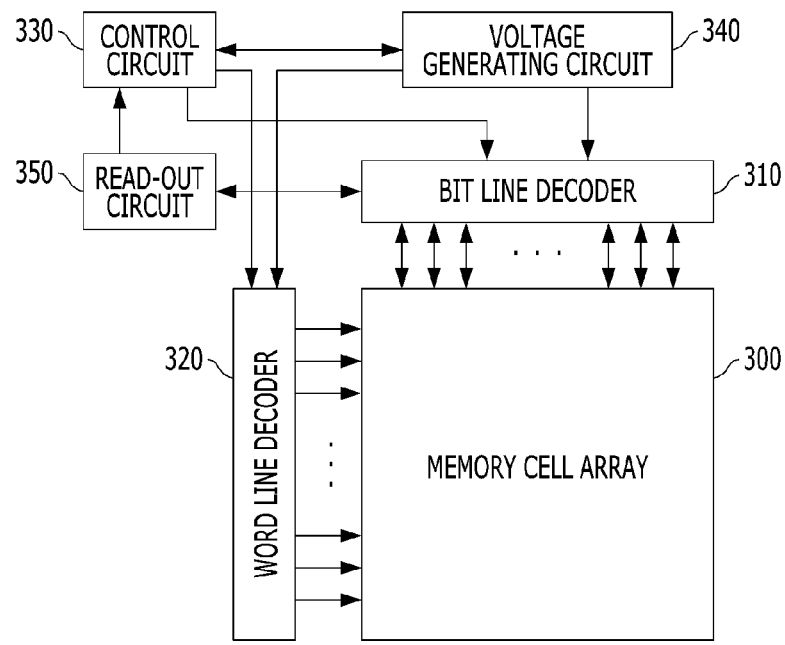
FIG. 11 shows a system including peripheral devices and a variable resistance memory device according to an embodiment of the present invention.

FIG. 11 shows a system including pheripheral devices and a variable resistance memory device according to an embodiment of the present invention.

Referring to FIG. 11, in a variable resistance memory device according to an embodiment of the present invention, memory cells (MC) in a memory cell array 300 are arranged in a matrix pattern. In a peripheral region of the memory cell array 300, a bit line decoder 310, a word line decoder 320, a control circuit 330, a voltage generating circuit 340, and a read-out circuit 350 may be provided.

The bit line decoder 310 is coupled to each of a plurality of bit lines BL of the memory cell array 300, and selects a bit line BL in response to an address signal corresponding to the selected bit line BL. Likewise, the word line decoder 320 is coupled to each of a plurality of word lines WL of the memory cell array 300 and selects a word line WL in response to the address signal corresponding to the selected word line WL. That is, a specific memory cell (MC) disposed at an intersection between the selected bit line BL and the selected word line WL in the memory cell array 300 may be selected in response to the address signal.

The control circuit 330 controls the bit line decoder 310, the word line decoder 320, and the voltage generating circuit 340 in response to the address signal, a control input signal, and an data input in the course of writing operation, thereby controlling writing, deleting, and read-out operations of the memory cell array 300. In an embodiment, the control circuit 330 may also serve as a general address buffer circuit, a data input/output buffer circuit, or a control input buffer circuit.

The voltage generating circuit 340 generates voltage necessary for writing, deleting, and reading out data operations in the memory cell array 300 and provides the voltage to the bit lines BL and the word lines WL.

The read-out circuit 350 detects resistance state of a selected memory cell (MC), reads out data stored in the selected memory cell (MC), and transmits the read-out data to the control circuit 330.

Figure 12:
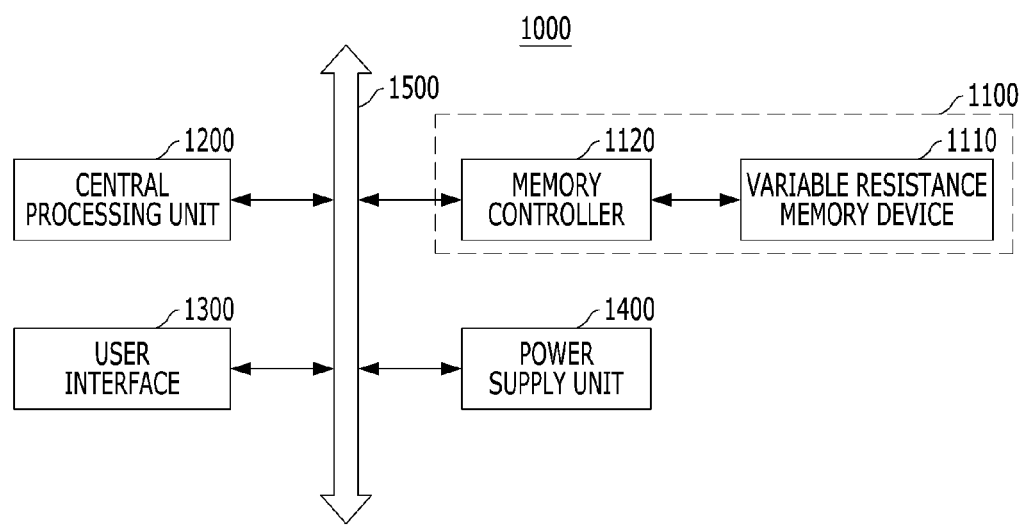
FIG. 12 shows an information processing system employing a variable resistance memory device according to an embodiment of the present invention.

FIG. 12 shows an information processing system employing a variable resistance memory device according to an embodiment of the present invention.

Referring to FIG. 12, an information processing system employing a variable resistance memory device according to an embodiment of the present invention may include a memory system 1100, a central processing unit 1200, a user interface 1300, and a power supply unit 1400, which can communicate with each other via a bus 1500.

The memory system 1100 may include a variable resistance memory device 1110, and a memory controller 1120. The variable resistance memory device 1110 may store data processed by the central processing unit 1200 or data transmitted from outside through the user interface 1300.

The information processing system 1000 may be employed by any electronic device for storing data, for example, a memory card, a solid state disk (SSD), any mobile communication device, etc.

As describe above, a variable resistance memory device and a method for forming the same according to an embodiment of the present invention reduces dissipation of heat generated in the metal-insulator transition (MIT) layer using a thermal boundary resistance (TBR) phenomenon, and thus current and voltage to operate the variable resistance memory device can be reduced.

Although various embodiments have been described for illustrative purposes, it will be apparent to those skilled in the art that various changes and modifications may be made without departing from the spirit and scope of the invention as defined in the following claims.

What is claimed is:

1. A variable resistance memory device comprising:
a first electrode;
a second electrode spaced apart from the first electrode;
a resistance variable layer and a metal-insulator transition layer provided between the first electrode and the second electrode;
and a heat barrier layer provided between the first electrode and the metal-insulator transition layer, between the metal-insulator transition layer and the resistance variable layer, or between the second electrode and the metal-insulator transition layer,
wherein the heat barrier layer includes an insulating material having a thickness that allows electron tunneling.

2. The variable resistance memory device of claim 1, wherein the heat barrier layer includes a material having a Debye temperature that is different from that of the metal-insulator transition layer.

3. The variable resistance memory device of claim 1, wherein the heat barrier layer includes metal, oxide, nitride, or a combination thereof.

4. The variable resistance memory device of claim 1, wherein the heat barrier layer includes a plurality of different layers, at least one of the different layers being formed of a different material.

5. The variable resistance memory device of claim 1, wherein the heat barrier layer has a thickness ranging from several angstroms (Å) to several tens of angstroms (Å).

6. The variable resistance memory device of claim 1, wherein the metal-insulator transition layer includes a material whose electrical resistance value abruptly changes at a critical temperature.

7. The variable resistance memory device of claim 1, wherein the metal-insulator transition layer includes at least one of niobium oxide (NbOx, 2≤x≤2.5) and vanadium oxide (VOx, 2≤x≤2.5).

8. The variable resistance memory device of claim 1, wherein the resistance variable layer includes a material having an electrical resistance value that varies depending on a change in oxygen vacancy, ion migration, or a phase change of the material.

9. The variable resistance memory device of claim 1, the device further comprising:
a third electrode provided between the metal-insulator transition layer and the resistance variable layer.

10. The variable resistance memory device of claim 9, wherein the third electrode is directly disposed between the metal-insulator transition layer and the resistance variable layer.

11. The variable resistance memory device of claim 1, the device further comprising:
a first wire line coupled to the first electrode and extending in a first direction, and a second wire line coupled to the second electrode and extending in a second direction.

12. The variable resistance memory device of claim 1, wherein the heat barrier layer is configured to reduce dissipation of heat generated in the metal-insulator transition layer.

13. A variable resistance memory device comprising:
a vertical electrode vertically extending from a substrate;
a plurality of interlayer insulating patterns and a plurality of horizontal electrodes, each of the interlayer insulating patterns and the horizontal electrodes being stacked in an alternating manner in a direction along which the vertical electrode extends;
a resistance variable layer and a metal-insulator transition layer provided between the vertical electrode and the horizontal electrodes; and
a heat barrier layer provided between the horizontal electrodes and the metal-insulator transition layer, between the metal-insulator transition layer and the resistance variable layer, or between the vertical electrode and the metal-insulator transition layer,
wherein the heat barrier layer includes an insulating material having a thickness that allows electron tunneling.

14. The variable resistance memory device of claim 13, wherein the heat barrier layer includes a material having a Debye temperature that is different from that of the metal-insulator transition layer.

15. The variable resistance memory device of claim 13, wherein the heat barrier layer includes metal, oxide, nitride, or a combination thereof.

16. The variable resistance memory device of claim 13, wherein the heat barrier layer includes a plurality of different layers, at least one of the different layers being formed of a different material.

17. The variable resistance memory device of claim 13, wherein the heat barrier layer has a thickness ranging from several angstroms (Å) to several tens of angstroms (Å).

18. The variable resistance memory device of claim 13, wherein the metal-insulator transition layer includes a material whose electrical resistance value abruptly changes at a critical temperature.

19. The variable resistance memory device of claim 13, wherein the metal-insulator transition layer includes at least one of niobium oxide (NbOx, $2 \leq x \leq 2.5$) and vanadium oxide (VOx, $2 \leq x \leq 2.5$).

20. The variable resistance memory device of claim 13, wherein the resistance variable layer includes a material having an electrical resistance value that varies depending on a change in oxygen vacancy, ion migration, or a phase change of the material.

21. The variable resistance memory device of claim 13, the device further comprising:
an intermediate electrode provided between the metal-insulator transition layer and the resistance variable layer.

22. The variable resistance memory device of claim 13, wherein the vertical electrode extends across the plurality of horizontal electrodes.

23. The variable resistance memory device of claim 13, wherein the heat barrier layer is configured to reduce dissipation of heat generated in the metal-insulator transition layer.

* * * * *